United States Patent
He et al.

(10) Patent No.: US 8,642,719 B2
(45) Date of Patent: Feb. 4, 2014

(54) SOLVENT MIXTURE FOR MOLECULAR WEIGHT CONTROL

(75) Inventors: Mingqian He, Horseheads, NY (US); James Robert Matthews, Painted Post, NY (US); Michael Lesley Sorensen, Waverly, NY (US)

(73) Assignee: Corning Incorporated, Corning, NY (US)

( * ) Notice: Subject to any disclaimer, the term of this patent is extended or adjusted under 35 U.S.C. 154(b) by 51 days.

(21) Appl. No.: 13/397,021

(22) Filed: Feb. 15, 2012

(65) Prior Publication Data

US 2012/0220713 A1     Aug. 30, 2012

Related U.S. Application Data

(60) Provisional application No. 61/447,524, filed on Feb. 28, 2011.

(51) Int. Cl.
 *C08G 75/00* (2006.01)

(52) U.S. Cl.
 USPC ........... 528/377; 528/378; 528/380; 528/370; 528/375; 528/376; 526/204; 526/216; 526/241; 526/256; 526/259; 524/547; 524/548

(58) Field of Classification Search
 USPC ............... 528/377, 378, 380, 370, 375, 376; 526/204, 216, 241, 256, 259; 524/547, 524/548
 See application file for complete search history.

(56) References Cited

U.S. PATENT DOCUMENTS

| | | | |
|---|---|---|---|
| 4,076,921 A | 2/1978 | Stol et al. | 526/89 |
| 4,463,164 A | 7/1984 | Dalton et al. | |
| 6,001,466 A | 12/1999 | Noguchi et al. | 428/327 |
| 6,353,072 B1 | 3/2002 | Towns et al. | |
| 6,881,803 B2 | 4/2005 | Endo et al. | 526/213 |
| 7,060,781 B2 | 6/2006 | Mitsui et al. | 528/217 |
| 7,282,554 B2 | 10/2007 | Mitsui et al. | 528/217 |
| 7,705,108 B2 | 4/2010 | He | 528/226 |
| 7,838,623 B2 | 11/2010 | He | 528/377 |
| 2005/0070685 A1 | 3/2005 | Mitsui et al. | |
| 2009/0230386 A1* | 9/2009 | Yamamoto et al. | 257/40 |
| 2011/0017956 A1 | 1/2011 | Hou et al. | |
| 2011/0105717 A1 | 5/2011 | Rauscher et al. | |

FOREIGN PATENT DOCUMENTS

| | | |
|---|---|---|
| DE | 10 2006 061966 | 6/2008 |
| EP | 2 169 007 | 3/2010 |

OTHER PUBLICATIONS

He et al.; "Importance of C2 Symmetry for the Device Performance of a Newly Synthesized Family of Fused-Ring Thiophenes"; Chemistry of Materials, American Chemical Society, vol. 22, No. 9, Sep. 1, 2010, pp. 2770-2779.

He et al.; "Alkylsubstituted Thienothiophene Semiconducting Materials: Structure-Property Relationships"; Journal of the American Chemical Society, vol. 131, No. 33, Jan. 1, 2009, pp. 11930-11938.

Fong et al.; "Tetrathienoacene Copolymers As High Mobility, Soluble Organic Semiconductors", Journal of American Chemical Society, vol. 130, No. 40, Oct. 8, 2008, pp. 13202-13203.

Aert et al.; "Controlled Molecular Weight by the Precipitation Polymerization of 2, 6-dimethylphenol", Journal of Macromolecular Science, Part A—Pure and Applied Chemistry, vol. 32, No. 3, Jan. 1, 1995, pp. 515-523.

PCT Search Report and Written Opinion issued on Jul. 3, 2012, in corresponding PCT Application Serial No. PCT/US2012/025856.

* cited by examiner

*Primary Examiner* — Shane Fang
(74) *Attorney, Agent, or Firm* — John L. Haack

(57) ABSTRACT

A method of making a polymer, including: heating, for a sufficient time and temperature, to polymerize a homogenous mixture including of at least one polymerizable monomer, and a solvent mixture comprised of at least a first liquid and a second liquid, the first liquid being a stronger solvent for the product polymer than the weaker second liquid, and the polymer product precipitates from the homogenous mixture during the heating, as defined herein. Also disclosed are semiconducting articles and printable inks prepared with the resulting narrow polydispersity polymers, as defined herein.

17 Claims, No Drawings

SOLVENT MIXTURE FOR MOLECULAR WEIGHT CONTROL

CLAIMING BENEFIT OF PRIOR FILED U.S. APPLICATION

This application claims the benefit of priority under 35 U.S.C. §119 of U.S. Provisional Application Ser. No. 61/447,524 filed on Feb. 28, 2011, the content of which is relied upon and incorporated herein by reference in its entirety.

The entire disclosure of any publication or patent document mentioned herein is incorporated by reference.

BACKGROUND

The disclosure generally relates to a method of making polymers, including semiconducting polymers. For additional background see commonly owned and assigned, U.S. Pat. No. 7,705,108, to He, M., et al., entitled "FUSED THIOPHENES, METHODS FOR MAKING FUSED THIOPHENES, AND USES THEREOF"; U.S. patent application Ser. No. 12/781,291, to He, M., et al., entitled "METHOD OF MAKING AN ORGANIC SEMICONDUCTOR DEVICE," filed May 17, 2010; U.S. Provisional Patent Application 61/649,079, to He, M., et al., entitled "POLYMERIC FUSED THIOPHENE SEMICONDUCTOR FORMULATION," filed May 27, 2010; and U.S. Provisional Patent Application 61/553,326, to He, M., et al., entitled "FUSED THIOPHENES, METHODS OF MAKING FUSED THIOPHENES, AND USES THEREOF," filed Oct. 31, 2011.

SUMMARY

The disclosure provides a solvent mediated method of making polymers, having a narrow polydispersity, including semiconducting polymers.

DETAILED DESCRIPTION

Various embodiments of the disclosure will be described in detail with reference to drawings, if any. Reference to various embodiments does not limit the scope of the invention, which is limited only by the scope of the attached claims. Additionally, any examples set forth in this specification are not limiting and merely set forth some of the many possible embodiments of the claimed invention.

DEFINITIONS

"Precipitation polymerization" or like terms as used herein refers to a polymerization reaction in which the polymer being formed becomes increasingly more insoluble in its own monomer or in a particular monomer-solvent combination and precipitates out of solution at a point, determined by for example, time, temperature, and solubility, soon after it is formed. Precipitation polymerization is a heterogeneous polymerization process that begins initially as a homogeneous system in the continuous phase, where the monomer(s), and co-reactant(s), such as co-monomer, chemical reagent, or like components, such as a catalyst or initiator are completely soluble, but upon initiation the formed polymer becomes more and more insoluble as polymer chain growth continues and precipitates from solution. In conventional precipitation polymerization, after precipitation, the polymerization can proceed by adsorption of monomer and initiator into the polymer particles (see e.g., G. Odian in Principles of Polymerization, 3rd ed., John Wiley and Sons, 1991, pp 302, and Van Aert, et al., Controlled molecular weight by the precipitation polymerization of 2,6-dimethylphenol, J. Macromolecular Sci., Pure and Applied Chemistry, (1995), A32 (3), 515-23.). In the present precipitation polymerization method, polymerization can continue for monomer(s) remaining in solution. However, polymerization is effectively retarded or completely terminated for polymer that has been precipitated from solution. Accordingly, the molecular weight properties of the precipitated polymer in the present disclosure are relatively invariant, and can attain and retain relatively constant and consistent narrow polydispersity properties. Although not desired to be bound by theory, the product polymer has reduced solubility in the solvent mixture as it grows in molecular weight. For a given solvent system the polymer will have a molecular weight range in which its solubility becomes so poor that it substantially completely precipitates out. While in the solid state the rate of continued chain growth is stopped or drastically reduced relative to the rate of growth of fully solvated species. This has the effect of allowing smaller (still solvated) chains to catch up in molecular weight with their already precipitated larger counterparts. This in turn leads to a narrower polydispersity for the polymer batch as a whole. This narrower polydispersity has an added advantage that it can likely produce better packing results in thin film devices. More ordered packing leads to less defect sites, which in turn leads to lower trap density for electrons and holes. Consequently, such thin film device can function more efficiently.

"Liquid," "liquid component," "solvent," "solvent mixture," and like terms refer to one or more of the disclosed organic fluids and mixtures thereof that can be selected for use in the disclosed methods and can include, for example, any of the specified strong solvents, intermediate-strength solvents, weak solvents, non-solvents, and mixtures thereof, or equivalents thereof.

"Strong solvent," "first solvent," and like terms refer to a relatively good to excellent solvent for the product polymer where the extent of solvency is characterized by the product polymer's solubility in the strong solvent.

"Weak solvent," "second solvent," and like terms refer to a relatively poor solvent or non-solvent for the product polymer where the extent of solvency or lack of solvency is characterized by the product polymer's relatively low solubility or no solubility in the solvent.

"FTx" or like abbreviations can refer to a fused thiophene compound, polymerizable monomers thereof, and polymers thereof, where x is an integer indicating the number of fused thiophene ring or cycle units fused into a single core unit, for example, an FT2 has two fused rings in the core unit, an FT3 has three fused rings in the core unit, an FT4 has four fused rings in the core unit, an FT5 has five fused rings in the core unit, and like higher designations in the core unit.

"Hydrocarbon," "hydrocarbyl," "hydrocarbylene," "hydrocarbyloxy," and like terms generally refer to monovalent, such as —R, or divalent —R— moieties, and can include, for example, alkyl hydrocarbons, aromatic or aryl hydrocarbons, alkyl substituted aryl hydrocarbons, alkoxy substituted aryl hydrocarbons, heteroalkyl hydrocarbons, heteroaromatic or heteroaryl hydrocarbons, alkyl substituted heteroaryl hydrocarbons, alkoxy substituted heteroaryl hydrocarbons, and like hydrocarbon moieties, and as illustrated herein.

"Alkyl" includes linear alkyls, branched alkyls, and cycloalkyls. "Substituted alkyl" or "optionally substituted alkyl" refers to an alkyl substituent, which can include, for example, a linear alkyl, a branched alkyl, or a cycloalkyl, having from 1 to 4 optional substituents selected from, for example, hydroxyl (—OH), halogen, amino (—NH$_2$ or —NR$_2$), nitro (—NO$_2$), acyl (—C(=O)R), alkylsulfonyl (—S(=O)$_2$R), alkoxy (—OR), (C$_{3-10}$)cycloalkyl, and like substituents, where R is a hydrocarbyl, aryl, Het, or like moieties, such as a monovalent alkyl or a divalent alkylene having from 1 to about 10 carbon atoms. For example, a hydroxy substituted alkyl, can be a 2-hydroxy substituted propylene of the formula —CH$_2$—CH(OH)—CH$_2$—, an alkoxy substituted alkyl, can be a 2-methoxy substituted ethyl of the formula —CH$_2$—CH$_2$—O—CH$_3$, an amino substituted alkyl, can be a 1-dialkylamino substituted ethyl of the formula —CH(NR$_2$)—CH$_3$, an oligo-(oxyalkylene), poly-(oxyalkylene), or poly-(alkylene oxide) substituted alkyl, can be, for example, of the partial formula —(R—O)$_x$—, where x can be, for example, from 1 to about 50, and from 1 to about 20, and like substituted oxyalkylene substituents, such as of the formula —(CR$_5$—CHR$_5$—O)$_x$— where R$_5$ is hydrogen or a substituted or unsubstituted (C$_{1-8}$) hydrocarbyl such as alkyl, and x is an integer of from 1 to about 50.

"Aryl" includes a mono- or divalent-phenyl radical or an ortho-fused bicyclic carbocyclic radical having about nine to twenty ring atoms in which at least one ring is aromatic. Aryl (Ar) can include substituted aryls, such as a phenyl radical having from 1 to 5 substituents, for example, alkyl, alkoxy, halo, and like substituents.

"Het" includes a four-(4), five-(5), six-(6), or seven-(7) membered saturated or unsaturated heterocyclic ring having 1, 2, 3, or 4 heteroatoms selected from the group consisting of oxy, thio, sulfinyl, sulfonyl, selenium, tellurium, and nitrogen, which ring is optionally fused to a benzene ring. Het also includes "heteroaryl," which encompasses a radical attached via a ring carbon of a monocyclic aromatic ring containing five or six ring atoms consisting of carbon and 1, 2, 3, or 4 heteroatoms each selected from the group consisting of non-peroxide oxy, thio, and N(X) wherein X is absent or is H, O, (C$_{1-4}$)alkyl, phenyl, or benzyl, and a radical of an ortho-fused bicyclic heterocycle of about eight to ten ring atoms derived therefrom, particularly a benzo-derivative or one derived by fusing a propylene, trimethylene, or tetramethylene diradical thereto.

In embodiments, halo or halide includes fluoro, chloro, bromo, or iodo. Alkyl, alkoxy, etc., include both straight and branched groups; but reference to an individual radical such as "propyl" embraces only the straight chain radical, a branched chain isomer such as "isopropyl" being specifically referred to.

The carbon atom content of various hydrocarbon-containing (i.e., hydrocarbyl) moieties can alternatively be indicated by a prefix designating a lower and upper number of carbon atoms in the moiety, i.e., the prefix Ci-j indicates a moiety of the integer "i" to the integer "j" carbon atoms, inclusive. Thus, for example, (C$_1$-C$_8$)alkyl or C$_{1-8}$alkyl refers to an alkyl of one to eight carbon atoms, inclusive, and hydrocarbyloxy such as (C$_1$-C$_8$)alkoxy or C$_{1-8}$alkoxy refers to an alkoxy radical (—OR) having an alkyl group of one to eight carbon atoms, inclusive.

Specifically, a C$_{1-8}$alkyl can be, for example, methyl, ethyl, propyl, isopropyl, butyl, iso-butyl, sec-butyl, tert-butyl, pentyl, 3-pentyl, hexyl, heptyl, or octyl; (C$_{3-12}$)cycloalkyl can be cyclopropyl, cyclobutyl, cyclopentyl, cyclohexyl, cycloheptyl, cyclooctyl, including bicyclic, tricyclic, or multi-cyclic substituents, and like substituents. Similarly, higher alkyls, such as C$_{9-40}$alkyl, are included in the scope of specific alkyl groups.

A specific "hydrocarbyl" can be, for example, (C$_{1-10}$)hydrocarbyl, including all intermediate chain lengths and values and (C$_{3-12}$)cyclohydrocarbyl including all intermediate values and ring sizes.

C$_{1-8}$alkoxy can be, for example, methoxy, ethoxy, propoxy, isopropoxy, butoxy, iso-butoxy, sec-butoxy, pentoxy, 3-pentoxy, hexyloxy, 1-methylhexyloxy, heptyloxy, octyloxy, and like substituents.

A —C(=O)(C$_{3-7}$)alkyl- or —(C$_{3-7}$)alkanoyl can be, for example, acetyl, propanoyl, butanoyl, pentanoyl, 4-methylpentanoyl, hexanoyl, or heptanoyl. Aryl (Ar) can be, for example, phenyl, naphthyl, anthracenyl, phenanthrenyl, fluorenyl, tetrahydronaphthyl, or indanyl. Het can be, for example, pyrrolidinyl, piperidinyl, morpholinyl, thiomorpholinyl, or heteroaryl. Heteroaryl can be, for example, furyl, imidazolyl, triazolyl, triazinyl, oxazoyl, isoxazoyl, thiazolyl, isothiazoyl, pyrazolyl, pyrrolyl, pyrazinyl, tetrazolyl, pyridyl, (or its N-oxide), thienyl, pyrimidinyl (or its N-oxide), indolyl, isoquinolyl (or its N-oxide) or quinolyl (or its N-oxide).

Other conditions suitable for formation and modification of the compounds, oligomers, polymers, composites, or like products of the disclosure, from a variety of starting materials or intermediates, as disclosed and illustrated herein are available. For example, see Feiser and Feiser, "Reagents for Organic Synthesis", Vol. 1, et seq., 1967; March, J. "Advanced Organic Chemistry," John Wiley & Sons, 4th ed. 1992; House, H. O., "Modern Synthetic Reactions," 2nd ed., W. A. Benjamin, New York, 1972; and Larock, R. C., "Comprehensive Organic Transformations," 2nd ed., 1999, Wiley-VCH Publishers, New York. The starting materials employed in the preparative methods described herein are, for example, commercially available, have been reported in the scientific literature, or can be prepared from readily available starting materials using procedures known in the field. It may be desirable to optionally use a protecting group during all or portions of the above described or alternative preparative procedures. Such protecting groups and methods for their introduction and removal are known in the art. See Greene, T. W.; Wutz, P. G. M. "Protecting Groups In Organic Synthesis," 2nd ed., 1991, New York, John Wiley & Sons, Inc.

"Monomer," "monomer(s)," "mer," "polymer source," or like terms refer to a compound that can be (or has already been) covalently combined or linked with one or more other monomers of like or different structure to form homogenous (homopolymers) or heterogeneous (e.g., copolymers, terpolymers, and like heteropolymers) chains of the target polymer. Suitable monomers as disclosed and illustrated herein or incorporated by reference can include, for example, low molecular weight polymerizable compounds, such as from about 50 to about 200 Daltons, and higher molecular weight compounds, such as from about 200 to about 10,000 Daltons. Polymerizable compounds can include for example, a dihalogenated aryl compound, a dihalogenated heteroaryl compound, a di-metalated aryl compound, a di-metalated heteroaryl compounds, a dihalogenated non-fused conjugated compound, a di-metalated non-fused conjugated compound, an unsaturated oligomeric compound, an unsaturated polymeric compound, and like mers, and salts thereof, or combinations thereof.

"Include," "includes," or like terms means encompassing but not limited to, that is, inclusive and not exclusive.

"About" modifying, for example, the quantity of an ingredient in a composition, concentrations, volumes, process temperature, process time, yields, flow rates, pressures, and like values, and ranges thereof, employed in describing the embodiments of the disclosure, refers to variation in the numerical quantity that can occur, for example: through typical measuring and handling procedures used for making compounds, compositions, composites, concentrates or use formulations; through inadvertent error in these procedures; through differences in the manufacture, source, or purity of starting materials or ingredients used to carry out the methods; and like considerations. The term "about" also encompasses amounts that differ due to aging of a composition or formulation with a particular initial concentration or mixture, and amounts that differ due to mixing or processing a composition or formulation with a particular initial concentration or mixture. The claims appended hereto include equivalents of these "about" quantities.

"Consisting essentially of" in embodiments can refer, for example, to a starting composition, an intermediate composition, or a final composition, and articles, devices, or any apparatus of the disclosure, and can include the components or steps listed in the claim, plus other components or steps that do not materially affect the basic and novel properties of the compositions, articles, apparatus, or methods of making and use of the disclosure, such as particular reactants, particular additives or ingredients, a particular agent, a particular surface modifier or condition, or like structure, material, or process variable selected. Items that may materially affect the basic properties of the components or steps of the disclosure or that may impart undesirable characteristics to the present disclosure include, for example, no or very low solubility of one or more of the starting materials in the solvent mixture, moderate to high solubility of the product polymer in the heated solvent mixture, unnecessary exposure of the starting compounds, the polymers, or the resulting coated semiconductor articles or devices to excessively high temperatures, and like contrary steps.

The indefinite article "a" or "an" and its corresponding definite article "the" as used herein means at least one, or one or more, unless specified otherwise.

Abbreviations, which are well known to one of ordinary skill in the art, may be used (e.g., "h" or "hr" for hour or hours, "g" or "gm" for gram(s), "mL" for milliliters, and "rt" for room temperature, "nm" for nanometers, "bp" for boiling point, and like abbreviations).

Specific and preferred values disclosed for components, ingredients, additives, and like aspects, and ranges thereof, are for illustration only; they do not exclude other defined values or other values within defined ranges. The formulations, compositions, devices, apparatus, and methods of the disclosure can include any value or any combination of the values, specific values, more specific values, and preferred values, including intermediate values and ranges, as described herein.

Highly conjugated organic materials, such as monomer or polymer compositions of the present disclosure, are being developed for use in a variety of applications, including for example field effect transistors (FETs), thin-film transistors (TFTs), organic light-emitting diodes (OLEDs), electro-optic (EO) applications, as conductive materials, as two photon mixing materials, as organic semiconductors, and as non-linear optical (NLO) materials. Highly conjugated organic materials can be used, for example, in devices such as RFID tags, an electroluminescent device, such as used in a flat panel display, a photovoltaic, a sensor, and like devices, or a combination thereof.

Molecular weight control of a growing polymer during synthesis is desirable where important properties of the final polymer depend on the molecular weight. Post-synthesis control can be challenging, wasteful, time consuming, and expensive. Controlling the molecular weight of the growing polymer by precipitation from the polymerization solution can be a useful technique to produce a narrow molecular weight distribution.

In embodiments, the disclosure provides a method of making polymers comprising using a mixture of solvents for the polymerization reaction media where at least one of the solvents is a good or strong solvent for the target polymer product and at least one solvent is a poor or weak solvent for the target polymer product. The mixture of strong and weak solvents also permits control of the polymer molecular weight by variation of the solvent mixture components and ratios of components.

In embodiments, the disclosure also provides for the use of the method to prepare a polymer comprised of at least one fused thiophene (FT) monomer.

In embodiments, the disclosure also provides for the use of solvents of similar vapor pressures at the temperature the polymerization reaction is performed at, or under some circumstances of a solvent system that azeotropes, so that a constant or near constant solvent ratio is obtained in the liquid phase at the reaction temperature. Additionally, the solvent ratio can be similar or identical to the room temperature solvent ratio.

In embodiments, the disclosure provides methods for preparing polymers that include monomers of a fused thiophene using a mixed solvent system. In embodiments, the disclosed method provides, for example: the solvents can be combined in any ratio necessary to provide the polymer product having any desired molecular weight within achievable boundary limits, up to that which can be achieved with a single best pure solvent. By limiting the molecular weight of the polymer to smaller values, the solubility of the product polymer in working solvents is increased. This solubility enhancement result has the following consequential advantages:

Larger concentration ranges of polymer solution are available.

Polymer solutions can have a longer shelf-life (e.g., less likely to precipitate in storage).

Polymer solutions can have easier processability.

Reduction or elimination of aggregation and the associated defects caused by excessive aggregation.

Applications requiring greater solubility and processability than previously available are now accessible.

In embodiments, the disclosure provides methods for making highly conjugated polymers having narrow polydispersity properties, such as Corning's FT4 and like polymers, which are suitable for the preparation of electronic devices like thin film transistors (TFT) and OFETs.

In embodiments, the disclosure also relates to the use of the aforementioned polymer compounds to formulate, or as part of a formulation, for semiconductor inks. These inks can be used, for example, for drop-casting, spin-casting, spin-coating, slot-die, and like deposition methods, of the semiconductor formulation to form semiconductor layers in the manufacture of semiconducting devices. These inks may also be used for printing, by various methods including ink-jet printing, gravure, or like printing methods, of semiconductor layers in the manufacture of semi-conducting devices, such as thin film transistor (TFT) devices.

Solvent-based or solvent mediated methods for making polymers having controlled properties have been described, see for example, U.S. Pat. No. 4,076,921 (glycol acrylate polymers and copolymers), U.S. Pat. No. 7,060,781 (2,6-dimethyphenol composition), U.S. Pat. No. 6,001,466 (coating composition comprising cationic fine particles of a crosslinked resin), U.S. Pat. No. 6,881,803 (method for producing copolymer of alkylvinyl ether and maleic anhydride), and U.S. Pat. No. 7,282,554 (low molecular weight polyphenylene ether). However, none of the aforementioned documents mention methods for the preparation of polymers, such as semiconducting polymers, by metal-coupling polymerization, such as fused thiophene based polymers, and having narrow polydispersity properties.

In embodiments, the disclosure provides semiconducting articles prepared by the disclosed polymerization methods and the resulting semiconducting polymers.

In embodiments, the disclosure provides an ink formulation including the polymer prepared by the disclosed process.

In a specific example, the method of making an organic semiconducting material having narrow polydispersity in accord with the present disclosure can include a polymer or copolymers of a fused thiophene, such as having an FT2 to FT5 core, and optionally one or more non-fused aryl or heteroaryl comonomers, and mixtures thereof.

In embodiments, the disclosure provides method of making a polymer, comprising:

heating, for a sufficient time and temperature, to polymerize a homogenous mixture comprised of at least one polymerizable monomer, and a solvent mixture comprised of at least a first liquid and a second liquid, the first liquid being a stronger solvent for the product polymer than the weaker second liquid, and the polymer product precipitates from the homogenous mixture during the heating.

In embodiments, the homogenous mixture can include at least two liquids, one first liquid being at least a strong solvent for the product polymer, and one second liquid being at least a weak solvent or non-solvent for the product polymer at ambient or room temperature. The at least one soluble polymerizable monomer and the resulting insoluble polymer are both thermally stable in the solvent mixture.

In embodiments, the heating can be, for example, a stepwise homogeneous metal catalyst promoted coupling polymerization of the at least one monomer.

In embodiments, the at least one monomer can be, for example, a mixture of an organometallic compound and an organic halide compound.

In embodiments, the at least one polymerizable monomer can have, for example, a mixture of a dihalogen substituted fused thiophene core compound and a di-tin substituted non-fused thiophene containing compound. In embodiments, the at least one monomer can be, for example, selected from, a dihalogenated aryl compound, a dihalogenated heteroaryl compound, a di-metalated aryl compound, a di-metalated heteroaryl compound, a salt thereof, or a combination thereof.

In embodiments, the product polymer can have, for example, a solubility in the first solvent of from about 0.001 to about 1 wt % at about 25° C., and the product polymer can have a solubility in the second solvent of less than about 0.001 wt % at about 25° C.

In embodiments, the first solvent and second solvent can have, for example, an approximate match in vapor pressure.

In embodiments, the heating can be, for example, accomplished at from about 65 to about 120° C., from about 70 to about 120° C., from about 80 to about 120° C., for about 90 to about 115° C., for about 95 to about 110° C., and like temperatures, including intermediate values and ranges.

In embodiments, the monomer can be a dihalogen substituted core compound including, for example, at least one substituted or unsubstituted FT2, FT3, FT4, FT5, FT6, or mixture thereof, and the di-tin substituted compound can be, for example, at least one substituted or unsubstituted, thiophene, di-thiophene, tri-thiophene, tetra-thiophene, or a mixture thereof. In embodiments, the heating can be accomplished in the presence of a suitable catalyst, such as $Pd(PPh_3)_4$, an initiator, or a combination thereof.

In embodiments, the product polymer can have, for example, a solubility at about 20° C. of greater than about 1 to about 10 mg per mL of the first solvent, and the product polymer can have, for example, a solubility of about 0 to less than about 1 mg of product polymer per mL in the second solvent.

In embodiments, the first solvent can be, for example, a compound having a boiling point of from about 100 to about 250° C. and the second solvent can be, for example, a compound having a boiling point of from about 100 to about 250° C., both solvents being at atmospheric pressure. The strong first solvent and the weak second solvent can have a boiling point difference, for example, of less than about 0 to about 20° C. at 1 atmosphere, of less than about 0 to about 10° C. at 1 atmosphere, and like differences including intermediate values and ranges.

In embodiments, the first solvent can be, for example, an aromatic or heteroaromatic compound having from 5 to 12 carbon atoms, and the second solvent can be, for example, an alkyl ester having from 5 to 12 carbon atoms. The first solvent can be, for example, at least one of benzene, toluene, xylene, mixed xylenes, dichlorobenzene, chlorobenzene, tetralin, decalin, and like solvents, or mixtures thereof, and the second solvent can be, for example, at least one of a $(C_{1-10})$alkyl acetate, $(C_{1-10})$alkyl proprionate, $(C_{1-10})$alkyl butyrate, a cyclic ester having from 4 to 10 ring carbon atoms, such as lactones, for example, valerolactone, and mixtures thereof. In embodiments, the strong first solvent can be toluene and the weak second solvent can be butyl acetate.

In embodiments, the strong first solvent can be, for example, toluene and the weak second solvent can be, for example, butyl acetate present, for example, in a first to second solvent volume ratio of from about 1:2 to about 2:1, of from about 1:4 to about 9:1, of from about 1:1 to about 8:1, and like ratios, including intermediate values and ranges.

In embodiments, the at least one polymerizable monomer can be, for example, a substituted or unsubstituted core comprised of a fused thiophene having from 2 to about 7 fused rings, a thiophene, an oligo-thiophene, or a combination thereof. The at least one polymerizable monomer can be, for example, a fused thiophene having 4 fused rings.

In embodiments, the at least one polymerizable monomer comprises at least two different monomers, such as two, three, four, or more, different monomers.

In embodiments, the two different monomers can be, for example, a substituted or unsubstituted fused thiophene having 4 fused rings and an oligo-thiophene having from 2 to about 4 contiguous substituted or unsubstituted thiophene moieties. In embodiments, the monomer is not, for example, a phenol, a phenylene ether, a vinyl chloride, a glycol acrylate, an alkylvinyl ether, or a maleic anhydride.

In embodiments, heating the homogenous mixture of the at least one monomer can include, for example:

a constant ratio of monomer to solvent mixture volume;

the first solvent and the second solvent having a same or similar vapor pressure;

the first solvent and second solvent form an azeotrope, or a combination thereof.

In embodiments, the at least one monomer can be, for example:
a compound of the formulas 1, 2, 3, 4, 5, or 6:

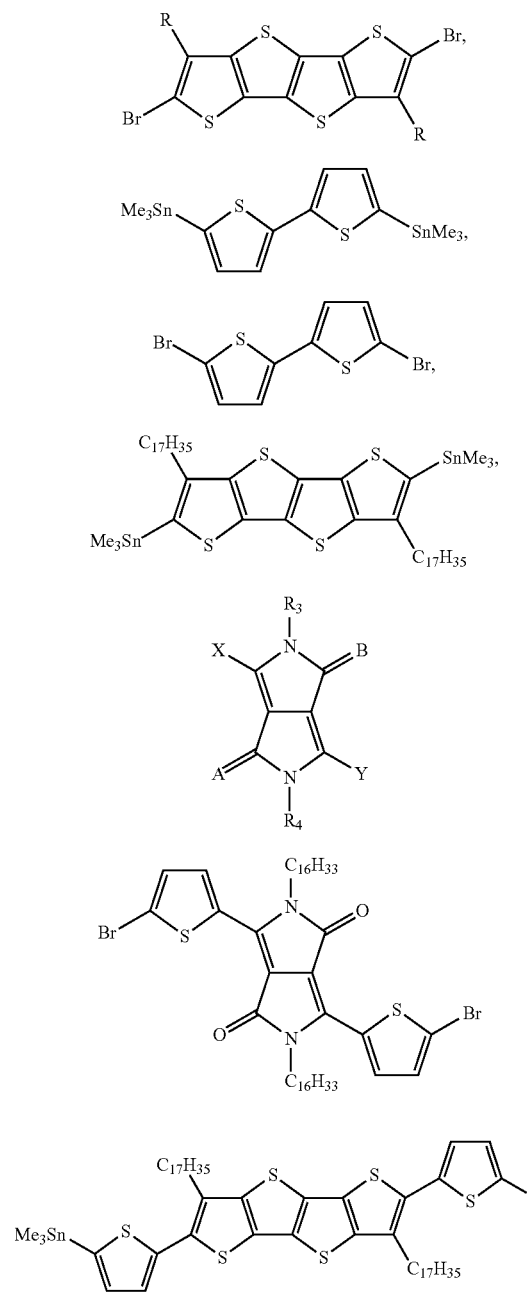

wherein X and Y are independently, halo-aryl, and A and B are, independently, either S or O, or a salt thereof, and mixtures thereof.

Examples of a dihalogenated non-fused conjugated compound are, for example, an Ar moiety including, for example, the above mentioned formula 3, wherein $R_3$ and $R_4$ are, independently, substituted or unsubstituted alkyl, substituted or unsubstituted alkenyl, substituted or unsubstituted alkynyl, aryl, cycloalkyl, alkyl, amino, ester, aldehyde, hydroxyl, alkoxy, thiol, thioalkyl, halide, acyl halide, acrylate, or vinyl ether, including protected forms of such substituents, and X and Y are independently halide, or a monovalent aryl halide, for example, 4-bromo-aryl-(Br—Ar—), for example, 5-bromothiophen-2-yl-(Br—($C_4H_2S$)—), or for example, 5'-bromo-2,2'-bithiophen-5-yl (i.e., Br—($C_4H_2S$)—($C_4H_2S$)—).

In embodiments, one polymer product is of the general formula 7:

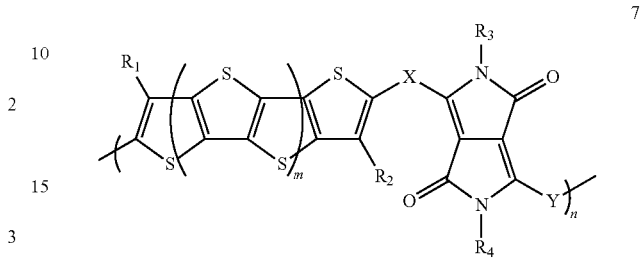

wherein n is an integer of 1 or more; m is an integer of 1 or more; X and Y are independently, a covalent bond or aryl; $R_1$ and $R_2$ are, independently, alkyl, alkenyl, alkynyl, aryl, cycloalkyl, aralkyl, amino, ester, aldehyde, hydroxyl, alkoxy, thiol, thioalkyl, halide, acyl halide, acrylate, or vinyl ether, including protected forms of such substituents; $R_3$ and $R_4$ are, independently, alkyl, alkenyl, alkynyl, aryl, cycloalkyl, aralkyl, amino, ester, aldehyde, hydroxyl, alkoxy, thiol, thioalkyl, halide, acyl halide, acrylate, or vinyl ether; and, A and B are, independently, either S or O.

In embodiments, another more specific polymer product is of the formula 8, where m in formula 7 is 1:

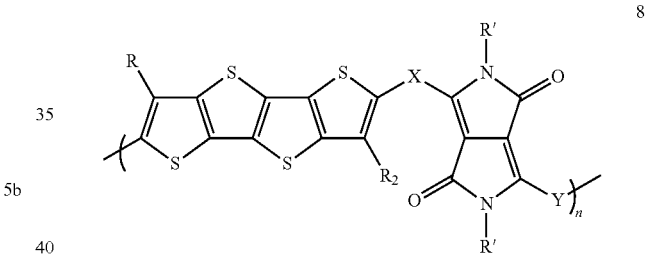

wherein n is an integer of 1 or more; X and Y are independently, a covalent bond or aryl; each R is independently, alkyl, alkenyl, alkynyl, aryl, cycloalkyl, aralkyl, amino, ester, aldehyde, hydroxyl, alkoxy, thiol, thioalkyl, halide, acyl halide, acrylate, or vinyl ether, including protected forms of such substituents; each R' is, independently, alkyl, alkenyl, alkynyl, aryl, cycloalkyl, aralkyl, amino, ester, aldehyde, hydroxyl, alkoxy, thiol, thioalkyl, halide, acyl halide, acrylate, or vinyl ether, including protected forms of such substituents; and, A and B are, independently, either S or O.

In embodiments, another polymer product is of the exemplary formula 9:

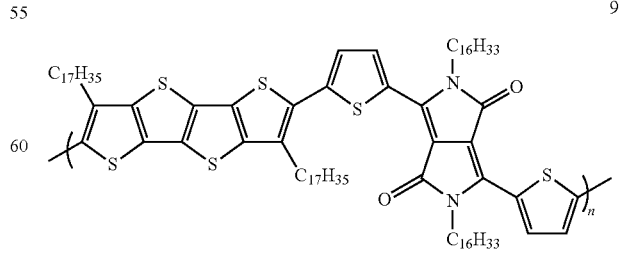

where X and Y are each thienyl, R is —$C_{17}H_{35}$, and R' is —$C_{16}H_{33}$.

In embodiments, the monomer selected can be a mixture of monomers, such as monomers of formulas 1 and 2:

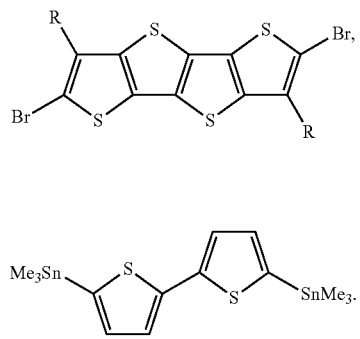

In embodiments, the product polymer can have, for example, a polydispersity less than about 2, such as from about 1.1 to about 2, from about 1.2 to about 1.8, from about 1.3 to about 1.7, from about 1.4 to about 1.6, and like polydispersities, including intermediate values and ranges.

In embodiments, the product polymer can have, for example, a polydispersity less than about 10, such as from about 9 to about 1, from about 8 to about 2, from about 7 to about 4, from about 6 to about 5, and like polydispersities, including intermediate values and ranges.

In embodiments, the method can further include, for example, a catalyst, an initiator, or a mixture thereof.

In embodiments, the disclosure provides a polymer ink formulation comprising a polymer prepared by the disclosed polymerization process. The prepared polymer can be an ink formulation that is thermally more stable than a polymer ink formulation having a polymer prepared in a single solvent, such as 100% toluene.

The preparation of fused-thiophene bithiophene alternating co-polymers has previously been achieved by, for example, mixing compounds 1 and 2 (Scheme 1) in toluene with tetrakis(triphenylphosphine)palladium(0), and heating under nitrogen at 110° C. for 16 hours (see commonly owned and assigned U.S. Pat. No. 7,838,623, issued Nov. 23, 2010). Capping agents, such as a monovalent thiophene, can optionally be added and the reaction continued for 3 hrs per capping agent equivalent to convert some end groups into the relatively inert thiophene termini instead of more reactive end groups, such as bromides, tin species, or metal complexes. However, capping agents are not completely efficient in converting all end groups. An acid wash can remove remaining tin species, but bromides species can remain. The mixture was then poured into a 1:1 mixture of methanol and acetylacetone. The polymer fully precipitated on dispersion in the methanol and acetylacetone solvent system and was stirred further for about 16 hrs. The polymer product was filtered off and then resuspended in a 5% solution of conc. HCl(aq) in methanol and stirred with mild heating, such about 35 to 50° C. for 4 hrs. The polymer was then filtered again and the residue placed in a soxhlet thimble. Extraction of impurities and lower molecular weight polymer species was achieved by double Soxhlet extraction, firstly with acetone for 24 hrs, and secondly with hexanes for 24 hrs. The freshly washed polymer was then dried and available for use.

Scheme 1: Polymerization reaction to form P2TDCXFT4.

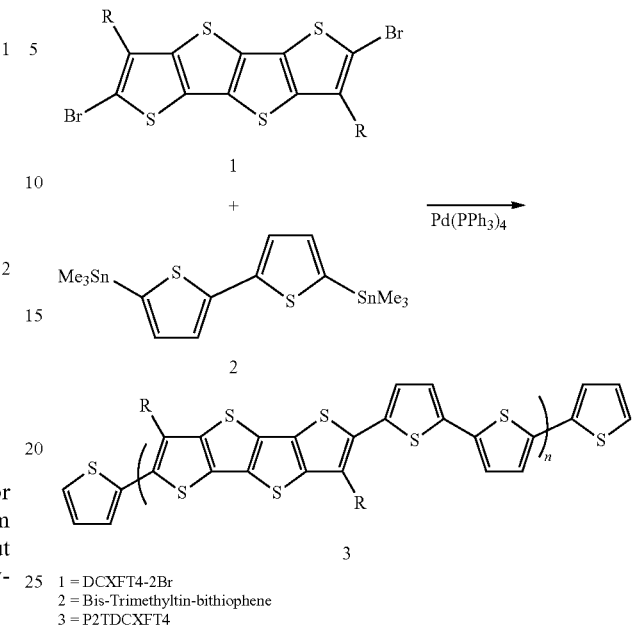

1 = DCXFT4-2Br
2 = Bis-Trimethyltin-bithiophene
3 = P2TDCXFT4

In embodiments, the disclosure provides different and improved conditions to perform the polymer synthesis of Scheme 1, where the molecular weight can be controlled to obtain lower molecular weight target values. The polymerization can be accomplished, for example, in pure toluene, where the polymer product precipitates out of solution once it attains a certain molecular weight, for example from about 5,000 to about 50,000, about 10,000 to about 25,000, and 15,000 to about 18,000, including intermediate values and ranges, depending upon conditions and parameters. This is caused by the decreasing solubility of the polymer as the molecular weight grows. Higher molecular weights may be obtained by using even stronger solvents, such as dichlorobenzene. The reactants and reagents are preferably both soluble at the polymerization reaction temperature.

In embodiments, the disclosure provides a method of making polymers that includes selecting a miscible solvent mixture comprising two or more liquids where one of the liquids can be a strong (e.g., good to excellent) solvent for the target product polymer and one of the liquids can be a weak (e.g., poor to non-) solvent for the target product polymer. The solvent mixture can be selected according to the present disclosure to achieve, for example, a controlled polymer precipitation event. The deliberate adjustment of the polymer precipitation point using mixed solvents provides a tool to control or limit the upper molecular weight of the target polymer molecular weight distribution relative to the prior synthesis procedure accomplished in toluene only. The introduction of different percentages of a weak solvent or non-solvent for the polymer, such as butyl acetate, causes a lower precipitation point, and provides polymer product having lower molecular weight properties. In embodiments, butyl acetate was chosen as a poor solvent because it has a boiling point comparable to toluene and is a weak solvent for the polymer. In embodiments, the polymerization reaction can be preferably performed at or near the boiling points of the mixed solvents. The mixed solvent boiling points can be used as a reasonable guide to the vapor pressures of the solvents. The vapor pressure of a solvent is 1 ambient atmosphere at its boiling point, and the atmospheric pressure boiling point of a liquid (or normal boiling point) is the temperature at which the vapor pressure equals the ambient atmospheric pressure. Thus on heating, the solvent ratio remains similar to the starting mixture ratio and does not change significantly over the course of the reaction as it might if a different poor solvent with very different boiling characteristics to that of toluene, such as for example acetone, were chosen. However, in principle any system of strong solvent and weak or non-solvent for the polymer can be used, though the degree of control will vary depending on the solubility of the polymer in each solvent and on the compatibility relationship between the solvents themselves.

Although not desired to be limited by theory, ternary or even more complex solvent systems can also be selected to provide further molecular weight control of the polymer synthesis and polymer properties.

A series of polymers of the form P2TDC17FT4 have been prepared using solvent mixtures. Specifically, different volume ratios (e.g., 100:0, 80:20, 60:40, 40:60) of toluene and butyl acetate were used to prepare a set of polymers. Table 1 below, shows the molecular weight data from GPC for these polymers measured in 1,2,4-trichlorobenzene at 160° C. using a viscometer and calculated relative to polystyrene standards. The absolute values for molecular weight given in Table 1 should not be relied upon as these polymers behave differently in GPC columns compared to standards used for calibration, such as polystyrene. However, relative values may be compared between or among polymers of the same repeat structure, such as batches of P2TDC17FT4 made using different solvent systems.

TABLE 1

GPC data for polymers synthesized in different strong:weak solvent mixtures.

| Solvent system for P2TDC17FT4 polymer preparation | Mw | Mn | PDI (Mn/Mw) |
| --- | --- | --- | --- |
| 100:0 v:v toluene:butyl acetate (positive control) | 18500 | 10500 | 1.7 |
| 80:20 v:v toluene:butyl acetate | 16300 | 9600 | 1.7 |
| 60:40 v:v toluene:butyl acetate | 13500 | 8600 | 1.6 |
| 40:60 v:v toluene:butyl acetate | 5300 | 3600 | 1.5 |

This set of P2TDC17FT4 polymers was used to compare the performance of the differently produced samples. Criteria used for assessing the polymer performance included:
  stability of the polymer solution as an ink formulation; and
  semi-conductor performance (mobility and threshold voltage) of devices made from the printed ink.

Polymer ink performance was assessed by preparing ink formulations comprised of polymer solutions using each of tetralin, o-xylene, m-xylene and p-xylene as solvents. The concentration of the polymer ink solutions was 3 mg/mL. All solutions were heated to about 130° C. for 2 hr to dissolve the polymer completely and then cooled to ambient temperature. A 2 mL portion of each polymer ink solution was then separately filtered through a clean 0.45 micrometer filter. Table 2 lists the observations of the polymer ink solutions after they were aged (i.e., stood) for one week at ambient conditions (e.g., about 20 to about 25° C.).

TABLE 2

Observations of polymer inks aged one week.

| Solvent system for P2TDC17FT4 polymer preparation | Tetralin ink solvent | o-Xylene ink solvent | m-Xylene ink solvent | p-Xylene ink solvent |
| --- | --- | --- | --- | --- |
| 100:0 v:v toluene:butyl acetate (positive control) | dark red - particles precipitated | dark red - particles precipitated | dark red - particles precipitated | dark red - particles precipitated |
| 80:20 v:v toluene:butyl acetate | dark red - particles precipitated | dark purple translucent | dark purple translucent | dark purple translucent |
| 60:40 v:v toluene:butyl acetate | dark red translucent | purple translucent | purple translucent | purple translucent |
| 40:60 v:v toluene:butyl acetate | orange translucent | orange translucent | orange translucent | orange translucent |

In addition to demonstrating that all three xylenes were superior solvents for dissolving the polymers compared to toluene, this experiment also demonstrated that, of the synthesis solvent systems tested, the polymer inks made from polymers synthesized in solvent mixtures were all more thermally stable than those made from polymer synthesized in 100% toluene. Films produced from these polymer solutions by spin-casting on HMDS treated SiO$_2$/Si substrates were also examined. The observations from this experiment are summarized in Table 3.

TABLE 3

Observations of spun-cast polymer films.

| Solvent system for P2TDC17FT4 polymer preparation | Tetralin as polymer film forming solvent | o-Xylene as polymer film forming solvent | m-Xylene as polymer film forming solvent | p-Xylene as polymer film forming solvent |
| --- | --- | --- | --- | --- |
| 100:0 v:v toluene:butyl acetate | significant agglomerated particles observed | uniform film; few particles observed | not tested | not tested |
| 80:20 v:v toluene:butyl acetate | significant agglomerated particles observed | uniform film; no particles observed | uniform film; few particles observed | uniform film; no particles observed |
| 60:40 v:v toluene:butyl acetate | uniform film; few particles observed | uniform film; no particles observed | not tested | not tested |
| 40:60 v:v toluene:butyl acetate | uniform film; no particles observed | uniform film; no particles observed | not tested | not tested |

Organic field effect transistors (OFETs), also known as thin film transistors (TFTs), were fabricated on the above mentioned films by vacuum deposition of gold source and drain electrodes and use of the silicon as a common gate with 300 nm of silica as the dielectric layer. Forty devices were measured from each film. Table 4 summarizes the results of the average device performance for each forty device set.

TABLE 4

Average device performance from spun-cast polymer films.

| Solvent system for P2TDC17FT4 polymer preparation | Ink solvent | $\mu max^1$ (cm2/Vs) | $\mu min^2$ (cm2/Vs) | $\mu ave^3$ (cm2/Vs) | $\sigma \mu ave^4$ (cm2/Vs) | Log (On/Off)[5] | $Vt^6$ (V) |
|---|---|---|---|---|---|---|---|
| 100:0 v:v toluene:butyl acetate | tetralin | 0.085 | 0.065 | 0.081 | 0.0053 | 5-6 | −8 |
|  | o-xylene | 0.073 | 0.065 | 0.072 | 0.003 | 5-6 | −7 |
| 80:20 toluene:butyl acetate | tetralin | 0.041 | 0.025 | 0.035 | 0.001 | 5-6 | −8 |
|  | o-xylene | 0.043 | 0.03 | 0.037 | 0.002 | 5-6 | −4 |
|  | m-xylene | 0.051 | 0.032 | 0.041 | 0.003 | 5-6 | −3 |
|  | p-xylene | 0.034 | 0.021 | 0.025 | 0.001 | 5-6 | −5 |
| 60:40 toluene:butyl acetate | tetralin | 0.023 | 0.013 | 0.017 | 0.00085 | 4-5 | −13 |
|  | o-xylene | 0.025 | 0.015 | 0.02 | 0.0005 | 4-5 | −7 |
| 60:40 toluene:butyl acetate | tetralin | 0.023 | 0.013 | 0.017 | 0.00085 | 4-5 | −13 |
|  | o-xylene | 0.025 | 0.015 | 0.02 | 0.0005 | 4-5 | −7 |

[1] μmax is the largest mobility measured for a single device,
[2] μmin is the smallest mobility measured for a single device,
[3] μave is the average mobility measured for forty devices,
[4] σ μave is the standard deviation of μave measurements,
[5] Log (On/Off) is the log10 of the ratio of on current to off current log(Ion/Ioff), and
[6] Vt is the threshold voltage averaged for 40 devices.

The results show that the devices made from polymer synthesized from an 80:20 mixture of toluene and butyl acetate solvent combination, while having slightly lower average mobility, had much better solubility, ink processability, and shelf-life compared to devices made from polymer synthesized in 100% toluene. The mobility, while lower, is still at an acceptable level for many applications. Mobilities from polymers produced in 60:40 toluene:butyl acetate (v:v) were only marginal. Mobilities from polymers produced in 40:60 toluene:butyl acetate (v:v) were generally even lower and less useful.

The improvements in shelf-life and processability of the polymers ink formulations made from polymers synthesized with solvent mixtures having a strong solvent and a weak solvent for the polymer have provided improved processability with a small and presently acceptable mobility reduction.

Alternative strong and weak solvents and boiling points are listed in Table 5 and Table 6, respectively.

TABLE 5

Strong Solvents

| Name | B.P. (° C.) |
|---|---|
| Toluene | 110-111 |
| Chlorobenzene | 132 |
| p-Xylene | 138 |
| m-Xylene | 138-139 |
| o-Xylene | 143-145 |
| 1,2-Dichlorobenzene | 178-180 |
| Decalin | 189-191 |
| Tetralin | 207 |
| Bicyclohexyl | 227 |
| Chloroform | 61 |

TABLE 6

Weak Solvents

| Name | B.P. (° C.) |
|---|---|
| Esters (Acetates) | |
| Propyl Acetate | 102 |
| Butyl Acetate | 124-126 |
| Pentyl Acetate | 142-149 |
| Hexyl Acetate | 168-170 |
| Ketones | |
| 2-Methyl-3-pentanone | 113 |
| 4-Methyl-2-pentanone | 117-118 |
| 2-Methyl-2-pentanone | 118 |
| 3-Hexanone | 123 |
| 2,4-Dimethyl-3-pentanone | 124 |
| 2-Hexanone | 127 |
| 2-Methyl-3-hexanone | 131-132 |
| 5-Methyl-2-hexanone | 145 |
| 4-Heptanone | 145 |
| 3-Heptanone | 146-149 |
| 2-Heptanone | 149-150 |
| 5-Methyl-3-heptanone | 157-162 |
| 2-Methyl-3-heptanone | 158-160 |
| 2,6-Dimethyl-4-heptanone | 165-170 |
| 3-Octanone | 167-168 |
| 2-Octanone | 173 |
| 5-Nonanone | 186-187 |

TABLE 6-continued

| Name | B.P. (° C.) |
|---|---|
| Weak Solvents | |
| 3-Nonanone | 187-188 |
| 2-Nonanone | 193 (calc from 192 @743 mmHg) |
| 3-Decanone | 204-205 |
| 2-Decanone | 211 |
| Alcohols | |
| 3-Pentanol | 115 |
| 1-Butanol | 116-118 |
| 2-Pentanol | 118 |
| 2-Methyl-2-pentanol | 120-122 |
| 3-Methyl-3-pentanol | 123 |
| 2-Methyl-3-pentanol | 128 |
| 3-Methyl-2-pentanol | 131-134 |
| 4-Methyl-2-pentanol | 132 |
| 3-Hexanol | 134-135 |
| 1-Pentanol | 136 |
| 2-Hexanol | 136 |
| 2-Methyl-2-hexanol | 141-142 |
| 2-Methyl-3-hexanol | 141-143 |
| 2-Methyl-1-pentanol | 148 |
| 3-Methyl-1-pentanol | 151-152 |
| 1-Hexanol | 156 |
| 2-Heptanol | 160-162 |
| 4-Methyl-1-pentanol | 160-165 |
| 5-Methyl-1-hexanol | 167-168 |
| 6-Methyl-2-Heptanol | 171-172 |
| 3-Heptanol | 172 (calc from 66 @20 mmHg) |
| 3-Ethyl-2,2-dimethyl-3-pentanol | 174 |
| 3-Octanol | 174-176 |
| 4-Octanol | 174-176 |
| 1-Heptanol | 176 |
| 2-Octanol | 179-180 |
| 2-Ethyl-1-hexanol | 183-186 |
| 2-Nonanol | 193-194 |
| 5-Nonanol | 195 |
| 1-Octanol | 196 |
| 1-Nonanol | 215 |
| Alkanes | |
| n-heptane | 98-99 |
| n-hexane | 69 |
| n-pentane | 36 |

Polymer is soluble in higher acetates at elevated temperatures, e.g., greater than about 150° C.

In embodiments, the disclosed process can be applied to other monomer or monomer combinations, such as metal and halogen containing monomers, for example in the same monomer or separated in respective comonomers. In embodiments, the disclosed process can be used the control or to vary the molecular weight properties of the target polymer. In embodiments, the ratio of monomer(s) to total solvent volume can be, for example, maintained as a constant, such as about 10 mmol to about 20 mmol of total monomer to about 300 mL to about 500 mL of the solvent mixture, and like ratios. In embodiments, the ratio of strong first to weak second solvent can be varied or shifted to attain desired changes or shifts in molecular weight and polydispersity properties of the target polymer. For example, as shown in the Table 1 summary of Examples 1 to 4, decreasing the amount of strong solvent and increasing the amount of weak second solvent (i.e., decreasing the ratio of strong to weak solvent combination) tended to reduce approximately proportionately both the Mn and Mw, which resulted in a slight but significant decrease in the PDI.

EXAMPLES

The working examples further describe the methods and how to make the articles of the disclosure.

General Procedure for Polymer Synthesis (Prophetic).

A septum is fitted to the thermocouple of a hotplate and an oil bath is pre-heated to 125° C. To a 3 neck 1 L round bottomed flask equipped with a magnetic stir bar are added a dibromo-fused thiophene compound (e.g., 2,6-dibromo-3,7-diheptadecylthieno[3,2-b]thieno[2',3':4,5]thieno[2,3-d]thiophene, DC17FT4-2Br monomer) (10 g, 11.3 mmol), a ditin-bithiophene comonomer (e.g., 5,5'-bis(trimethylstannyl)-2,2'-bithiophene) (5.54 g, 11.3 mmol), toluene (240 mL), and butyl acetate (60 mL) (4:1=v:v). A condenser and two septa are fitted to each of the necks of the flask. The top of the condenser is connected to a nitrogen manifold and the stirring is started. Nitrogen is bubbled through the mixture for 5 min via a needle through one septum. While maintaining the nitrogen bubbling, one septum is removed long enough to add tetrakistriphenylphosphinepalladium(0) (650 mg 0.562 mmol), then closed. The thermocouple is immersed in the reaction mixture. Nitrogen bubbling is continued for 5 min more then the needle is removed. The flask is then immersed in the pre-heated oil bath and the hotplate with thermocouple is set to regulate the reaction mixture temperature at 110° C. for 16 h. While continuing to stir at 110° C., 2-tributyltin-thiophene (420 mg, 1.13 mmol) (capping agent) is weighed into a syringe and added through one of the septa. After 3 h more 2-bromothiophene (230 mg, 1.98 mmol) is weighed into a syringe and added through one of the septa. After a further 3 h the reaction mixture is removed from the oil bath and poured into a stirring mixture of methanol (1 L) and acetylacetone (1 L). The newly formed suspension is stirred for 16 h at room temperature. The polymer is filtered from the solution then resuspended in methanol (500 mL). While stirring the suspension hydrochloric acid (35% aq, 20 mL) is added. The stirring suspension is heated to approximately 40° C. for 3 h. The polymer is filtered from the suspension then washed with methanol (100 mL). The crude polymer is then loaded into a Soxhlet thimble and Soxhlet extracted for 24 h using acetone as the extraction solvent. The solvent is then exchanged for hexane and Soxhlet extracted for 24 h. The Soxhlet thimble is then removed from the Soxhlet body and flushed with acetone by repeated filling and draining (4 thimble volumes). The polymer is removed from the thimble and dried under vacuum to give the typical product as a red solid.

Generally, the extraction process raises the apparent molecular weight slightly by removing lower molecular weight polymer material, and slightly reduces the apparent polydispersity (PDI).

The homogenous starting mixture, typically yellow in color, becomes a dark purple-red color as the polymer reaction progresses. There is some evidence that the reaction

Example 1

Polymer Synthesis Having an 80:20 Strong:Weak Solvent Ratio

A batch of polymer was synthesized with an 80:20 strong:weak solvent ratio following the general procedure, with the following modifications: Exact quantities used were, DC17FT4-2Br (9.00 g, 10.15 mmol), Ditin-Bithiophene (4.99 g, 10.15 mmol), toluene (216 mL), butyl acetate (54 mL), Tetrakistriphenylphosphine palladium(0) (585 mg, 5.06 mmol), 2-tributyltinthiophene (378 mg, 1.02 mmol), 2-bromothiophene (213 mg, 1.27 mmol). In this process the proportion of workup solvents to polymer was different from the general procedure. The reaction mixture was poured into methanol (1800 mL) and acetylacetone (1800 mL). The acid washing step was achieved using methanol (1300 mL) and hydrochloric acid (35% aq, 54 mL). The process gave 8.0 g of polymer (P2TDC17FT4) in an isolated yield of 88.4% (based on the combined starting monomers).

Example 2

Polymer Synthesis Having a 90:10 Strong:Weak Solvent Ratio

A batch of polymer was synthesized with an 90:10 strong:weak solvent ratio following the general procedure, with the following modifications: Exact quantities used, DC17FT4-2Br (1.00 g, 1.13 mmol), Ditin-Bithiophene (554 mg, 1.13 mmol), toluene (27 mL), butyl acetate (3 mL), Tetrakistriphenylphosphine palladium(0) (65 mg, 0.562 mmol), 2-tributyltinthiophene (42 mg, 0.113 mmol), 2-bromothiophene (24 mg, 0.143 mmol). The reaction mixture was poured into methanol (200 mL) and acetylacetone (200 mL). The acid washing step was achieved using methanol (150 mL) and hydrochloric acid (35% aq, 6 mL). The process gave 920 mg of polymer (P2TDC17FT4) for an isolated yield of 91.5% (based on the combined starting monomers).

Example 3

Polymer Synthesis Having a 60:40 Strong:Weak Solvent Ratio

A batch of polymer was synthesized with an 60:40 strong:weak solvent ratio following the general procedure, with the following modifications: Exact quantities used, DC17FT4-2Br (1.00 g, 1.13 mmol), ditin-bithiophene (554 mg, 1.13 mmol), toluene (18 mL), butyl acetate (12 mL), tetrakistriphenylphosphine palladium(0) (65 mg, 0.562 mmol), 2-tributyltinthiophene (42 mg, 0.113 mmol), 2-bromothiophene (24 mg, 0.143 mmol). The reaction mixture was poured into methanol (200 mL) and acetylacetone (200 mL). The acid washing step was achieved using methanol (150 mL) and hydrochloric acid (35% aq, 6 mL). The process gave 860 mg of polymer (P2TDC17FT4) for an isolated yield of 85.5% (based on the combined starting monomers).

Example 4

Polymer Synthesis Having a 40:60 Strong:Weak Solvent Ratio

A batch of polymer was synthesized with an 40:60 strong:weak solvent ratio following the general procedure, with the following modifications: Exact quantities used, DC17FT4-2Br (1.00 g, 1.13 mmol), ditin-bithiophene (554 mg, 1.13 mmol), toluene (12 mL), butyl acetate (18 mL), tetrakistriphenylphosphine palladium(0) (65 mg, 0.562 mmol), 2-tributyltinthiophene (42 mg, 0.113 mmol), 2-bromothiophene (24 mg, 0.143 mmol). The reaction mixture was poured into methanol (200 mL) and acetylacetone (200 mL). The acid washing step was achieved using methanol (150 mL) and hydrochloric acid (35% aq, 6 mL). As this polymer is soluble in hot hexane no Soxhlet extraction with hexanes was performed. The polymer was removed from the Soxhlet after 24 hrs of extraction with acetone, and dried under vacuum without further work-up. The process gave 820 mg of polymer (P2TDC17FT4) in an isolated yield of 81.5% (based on the combined starting monomers).

Comparative Example 5

Polymer Synthesis Having an 100:0 Strong:Weak Solvent Ratio (100% Toluene)

A batch of polymer was synthesized with an 100:0 strong:weak solvent ratio following the general procedure, with the following modifications: Exact quantity of toluene used was 300 mL. The process produced 9.6 g of polymer (P2TDC17FT4) in an isolated yield of 95.6% (based on the combined starting monomers.).

Comparative Example 6

Polymer Synthesis Having a 100:0 Strong:Weak Solvent Ratio (100% Chlorobenzene)

A batch of polymer was synthesized with an 100:0 strong:weak solvent ratio following the general procedure, with the following modifications: Exact quantities used: DC17FT4-2Br (1.00 g, 1.13 mmol), Ditin-Bithiophene (554 mg, 1.13 mmol), chlorobenzene (30 mL), Tetrakistriphenylphosphine palladium(0) (65 mg, 0.562 mmol), 2-tributyltinthiophene (42 mg, 0.113 mmol), 2-bromothiophene (24 mg, 0.143 mmol). In this process the internal reaction temperature was not controlled directly. The oil bath temperature was controlled to be 125° C. The reaction mixture was poured into methanol (200 mL) and acetylacetone (200 mL). The acid washing step was achieved using methanol (150 mL) and hydrochloric acid (35% aq, 6 mL). The process gave 900 mg of polymer (P2TDC17FT4) in an isolated yield of 89.6% (based on the combined starting monomers).

GPC (polystyrene) Mw 20200, Mn 16900, PDI=1.2.

The disclosure has been described with reference to various specific embodiments and techniques. However, it should be understood that many variations and modifications are possible while remaining within the scope of the disclosure.

Example 7

Polymer Synthesis Having a 70:30 Strong:Weak Solvent Ratio Using a Di-Metalated (Di-Tin) Fused Thiophene Compound and a Dihalogenated Non-Fused Conjugated Compound as Monomers

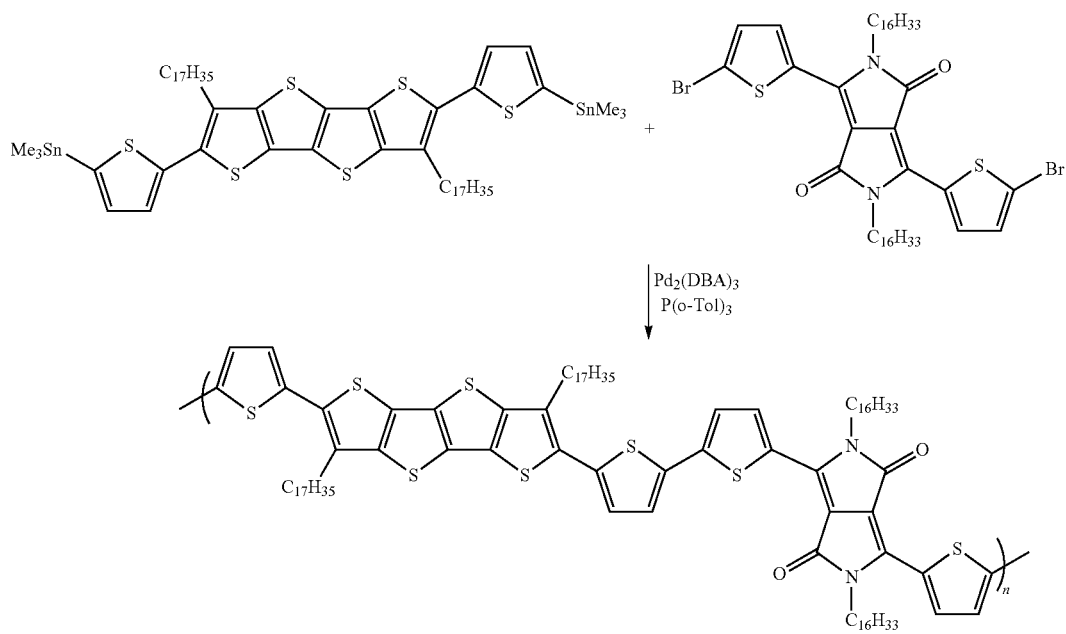

An oil bath was pre-heated to 70° C. To a 3 neck 250 mL round bottomed flask equipped with a magnetic stir bar were added 2,6-bis(5-(trimethylstannyl)thiophen-2-yl)-3,7-diheptadecylthieno[3,2-b]thieno[2',3':4,5]thieno[2,3-d]thiophene (e.g., ditin-thienyl-DC17FT4 monomer) (778 mg, 0.638 mmol), 3,6-bis(5-bromothiophen-2-yl)-2,5-dihexadecylpyrrolo[3,4-c]pyrrole-1,4(2H,5H)-dione (e.g., dibromothienyl-diketopyrrolopyrrole comonomer) (579 mg, 0.638 mmol), bis(dibenzylideneacetone)palladium(0) (14.3 mg, 15.6 micromol), tri(o-tolyl)phosphine (18.9 mg, 62.1 micromol), chloroform (strong) (14 mL) and hexane (weak) (6 mL) (7:3=v:v). A condenser and two septa were fitted, one to each of the necks of the flask. The top of the condenser was connected to a nitrogen manifold and the flask was immersed in a dry ice and acetone bath (−78° C.). The reaction mixture was subjected to freeze thaw vacuum degassing with a total of four freeze thaw cycles before warming to room temperature under nitrogen. The flask was then immersed in the pre-heated oil bath and the reaction mixture stirred for 4 h, at which time significant precipitate was observed. The reaction mixture was then removed from the oil bath and poured into a stirring beaker of methanol (400 mL). The newly formed suspension was stirred for 16 h at room temperature. The polymer was filtered from the solution then loaded into a Soxhlet thimble and Soxhlet extracted for 24 h using acetone as the extraction solvent. The solvent was then exchanged for hexane and Soxhlet extracted for 8 h. The solvent was then exchanged for methylene chloride and Soxhlet extracted for 16 h. The Soxhlet thimble was then removed from the Soxhlet and the polymer was removed from the thimble and dried under vacuum to give the product as a dark green/black solid. Yield (660 mg, 63%) as a dark green/black solid).

The above procedure was repeated exactly, with the exception that the mixed solvent system of chloroform (14 mL) and hexane (6 mL) (7:3=v:v) was replaced with neat chloroform (20 mL) (single solvent) and the reaction was run for a shorter time of 1 h because precipitation was already significant at that point. The yield was 810 mg, 77%, as a dark green/black solid. The molecular weight and polydispersity results for the control and the mixed solvent system are summarized in Table 7.

TABLE 7

| Solvent System | $M_n$ | $M_w$ | PDI |
|---|---|---|---|
| 100% Chloroform (strong single solvent system; control) | 18700 | 141000 | 7.5 |
| 70:30 Chloroform: Hexane (strong:weak mixed solvent system) | 12900 | 46800 | 3.6 |

The disclosure has been described with reference to various specific embodiments and techniques. However, it should be understood that many variations and modifications are possible while remaining within the scope of the disclosure.

What is claimed is:
1. A method of making a polymer, comprising:
heating, for a sufficient time and temperature, to polymerize a homogenous mixture comprised of at least one polymerizable monomer, and a solvent mixture comprised of at least a first liquid and a second liquid, the first liquid being a stronger solvent for the product polymer than the weaker second liquid, and the polymer product precipitates from the homogenous mixture during the heating, the at least one polymerizable monomer comprises at least two different monomers, and the two different monomers comprise a substituted or unsubstituted fused thiophene core having 4 fused rings and an oligothiophene having from 2 to about 4 contiguous substituted or unsubstituted thiophene moieties.

2. The method of claim 1 wherein the heating comprises a stepwise homogeneous metal catalyst promoted coupling polymerization of the at least one monomer.

3. The method of claim 1 wherein the at least two different monomers comprise a mixture of an organometallic compound and an organic halide compound.

4. The method of claim 1 wherein the at least two different monomers comprise a mixture of a dihalogen substituted fused thiophene core compound and a di-tin substituted non-fused oligo-thiophene containing compound.

5. The method of claim 1 wherein at least one monomer of the two different monomers is selected from a dihalogenated aryl compound, a dihalogenated heteroaryl compound, a di-metalated aryl compound, a di-metalated heteroaryl compound, a dihalogenated non-fused conjugated compound, a di-metalated non-fused conjugated compound, a salt thereof, or a combination thereof.

6. The method of claim 1 wherein the product polymer has a solubility in the first solvent of from about 0.001 to about 1 wt % at about 25° C., and the product polymer has a solubility in the second solvent of less than about 0.001 wt % at about 25° C.

7. The method of claim 1 wherein the first solvent and second solvent have an approximate match in vapor pressure.

8. The method of claim 1 wherein the heating is accomplished at from about 70 to about 120° C.

9. The method of claim 1 wherein the product polymer has a solubility at about 20° C. of greater than about 1 to about 10 mg per mL of the first solvent, and the product polymer has a solubility of about 0 to less than about 1 mg of product polymer per mL in second solvent.

10. The method of claim 1 wherein the first solvent comprises a compound having a boiling point of from about 100 to about 250° C. and the second solvent comprises a compound having a boiling point of from about 100 to about 250° C., both solvents at atmospheric pressure.

11. The method of claim 1 wherein the first solvent comprises an aromatic or heteroaromatic compound having from 5 to 12 carbon atoms and the second solvent comprises an alkyl ester having from 5 to 12 carbon atoms.

12. The method of claim 1 wherein the first solvent comprises at least one of benzene, toluene, xylene, mixed xylenes, dichlorobenzene, chlorobenzene, tetralin, decalin, and mixtures thereof, and the second solvent comprises at least one of a $(C_{1-10})$alkyl acetate, $(C_{1-10})$alkyl proprionate, $(C_{1-10})$alkyl butyrate, a cyclic ester having from 4 to 10 ring carbon atoms, and mixtures thereof.

13. The method of claim 1 wherein the strong first solvent is toluene or xylene and the weak second solvent is butyl acetate present in a volume ratio of from about 1:2 to about 2:1.

14. The method of claim 1 wherein heating comprises:
a constant ratio of monomer to solvent mixture volume;
the first solvent and second solvent having a same or similar vapor pressure;
the first solvent and second solvent forming an azeotrope, or a combination thereof.

15. The method of claim 1 wherein the at least one monomer of the two different monomers comprises:

a compound of the formulas 1, 2, 3, 4, 5, or 6:

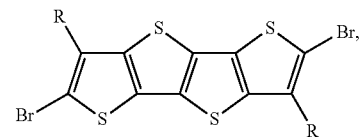

1

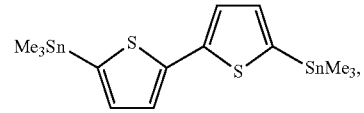

2

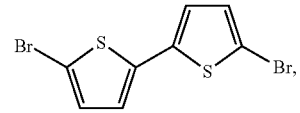

3

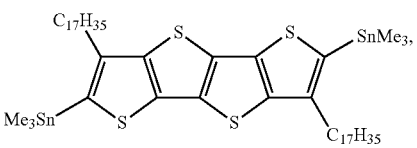

4

5a

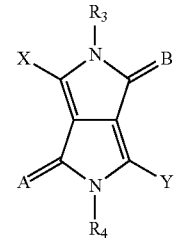

5b

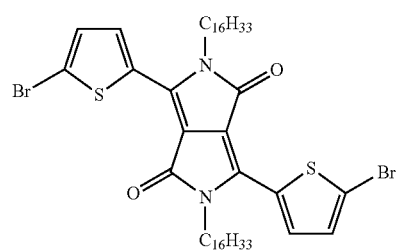

6

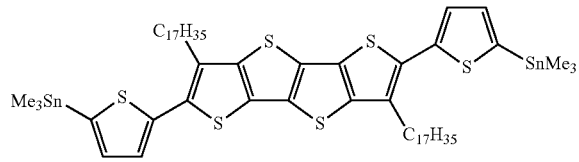

wherein X and Y are independently, halo-aryl, and A and B are, independently, S or O, or a salt thereof, and mixtures thereof.

16. The method of claim 1 wherein the product polymer has a polydispersity of from about 1.1 to about 2.

17. The method of claim 1 further comprising a catalyst, an initiator, or a mixture thereof.

* * * * *